United States Patent [19]

Harrison et al.

[11] Patent Number: 4,636,757

[45] Date of Patent: Jan. 13, 1987

[54] MICROSTRIP/SLOTLINE FREQUENCY HALVER

[75] Inventors: Robert G. Harrison; Grigorios A. Kalivas, both of Ottawa, Canada

[73] Assignee: Her Majesty the Queen in right of Canada, as represented by the Minister of National Defence, Ottawa, Canada

[21] Appl. No.: 772,910

[22] Filed: Sep. 5, 1985

[30] Foreign Application Priority Data

Mar. 7, 1985 [CA] Canada .................................. 476019

[51] Int. Cl.⁴ ............................................. H01P 1/20
[52] U.S. Cl. .................................. 333/218; 333/21 R; 333/238
[58] Field of Search ........................ 333/26, 218, 247; 363/158; 455/327

[56] References Cited

U.S. PATENT DOCUMENTS 4,228,411 10/1980 Harrison ............................. 333/218
4,266,208 5/1981 Cornish ............................... 333/218
4,523,163 6/1985 Houdart et al. .................... 333/218

Primary Examiner—Paul Gensler
Attorney, Agent, or Firm—Larson and Taylor

[57] ABSTRACT

A microwave microstrip/slotline frequency-halving circuit configuration is disclosed in which the frequency division is based on the principle of parametric subharmonic generation. The circuit comprises a subharmonic resonator formed partially by the overlap of an open-circuited microstrip line on one side of a dielectric substrate and a short-circuited slotline in the ground-plane on the other side of the substrate. The resonator is completed by a pair of varactor diodes symmetrically placed in holes in the dielectric substrate so as to form connections between the end of the microstrip line and the two sides of the slotline below. An input signal at frequency 2f entering via the microstrip line results in the propagation of a signal at frequency f in the output slotline.

14 Claims, 6 Drawing Figures

MICROSTRIP/SLOTLINE FREQUENCY HALVER

This invention relates generally to microwave frequency dividers, in particular to frequency halvers; that is, to frequency dividers providing division of a band of microwave frequencies by a factor of two.

Known devices for performing the operation of microwave frequency division are of two basic types: digital and analog.

Digital frequency dividiers as known in the art are essentially high-speed implementations of the well-known flip-flop circuit, which is composed of a plurality of cross-coupled active devices, such as bipolar or field-effect transistors. Digital dividers capable of operating at microwave frequencies have been manufactured using silicon bipolar emitter-coupled logic technology by Plessey Semiconductors, Swindon, England; for example model SP 86191B will divide by four at an input frequency of 1.5 GHz. Digital dividers able to operate at higher input frequencies have been manufactured using gallium arsenide field-effect transistor integrated circuit technology by Harris Microwave Semiconductor Inc., Milpitas, Calif.; for example model HMD-11016-1 will divide by 2, 4 or 8 at an input frequency of 2.0 GHz. Such digital dividers operate with square waves. Since a reasonable approximation to a square wave requires the presence of frequency components up to a least the third harmonic and perhaps up to the ninth harmonic in addition to the fundamental, a digital divider can operate at a maximum rate which is only a small fraction, such as one-ninth to one-third, of the maximum capability of the active devices of which the divider is composed.

Analog frequency dividers in contrast can operate at higher input frequencies than their digital counterparts because they can operate with sinusoidal waves, that is, there is no necessity for the presence of square waveforms. Analog frequency dividers can be based on several different principles including the mixer-with-feedback divider, the transferred-electron-device divider, the injection-locked-oscillator divider and the parametric-subharmonic-resonator divider. The mixer-with-feedback frequency divider, as described by Ahamed et al in "Study and Fabrication of a Frequency Divider-Multiplier Scheme for High-Efficiency Microwave Power", IEEE Transactions on Communications, Vol. COM-24, No. 2, February 1976, pp. 243–249, operates with an input frequency of 4 Gz. An experimental 12 GHz embodiment of this divider showed poor transient response and narrow bandwidth because of the time-delay of the feedback loop. The transferred-electron device divider as proposed by Upadhyayula et al in "Microwave Frequency Dividers", RCA Review, Vol. 34, December 1973, pp. 595–607 showed division by factors 2, 3 or 4 for input frequencies near 10 GHz but is limited to maximum fractional bandwidths of approximately 10%. The injectionlocked-oscillator divider, as proposed by Mawhinney in "Wideband Microwave Frequency Divider", U.S. Pat. No. 4,357,580, Nov. 2, 1982, is not a true frequency divider in the sense that if the injected locking signal is removed, or is outside the locking bandwidth, unwanted output signals will occur. Parametric-subharmonic-resonator frequency dividers using an unbalanced circuit with a single varactor were first described by Sterzer in "Microwave Parametric Subharmonic Oscillators for Digital Computing", Proceedings of the IRE, Vol. 47, No. 8, August 1959, pp. 1317–1324 and later by Lipparini, et al in "A New Approach to the Computer-Aided Design of Nonlinear Networks and its Application to Microwave Parametric Frequency Dividers", IEEE Transactions on Microwave Theory and Techniques, Vol. MTT-30, No. 7, July 1982, pp. 1051–1058. Because of their unbalanced structure, these frequency dividers have an output signal which contains harmonics of all orders of the desired half-frequency. On the other hand, balanced two-varactor parametric-subharmonicresonator frequency dividers, as disclosed by Harrison in "Broadband Frequency Divider Using Microwave Varactors" in U.S. Pat. No. 4,152,680, May 1, 1979 and also by Harrison in "Broadband Frequency Divider in Waveguide" in U.S. Pat. No. 4,228,411, Oct. 14, 1980, provided suppression of all even-order harmonics of the desired half-subharmonic output frequency and, because of the consequently diminished output filtering requirement, exhibit improved transient response. Although embodiments of the inventions disclosed in these two patents have demonstrated high frequencies and wide bandwidths of operation, namely an input range of 8 to 16 GHz (one octave) in the case of the microstrip/coplanar-waveguide (CPW) structure disclosed in U.S. Pat. No. 4,152,680 and an input range of 12.4 to 18 GHz (the full WR-62 waveguide band) in the case of the rectangular waveguide structure disclosed in U.S. Pat. No. 4,228,411, both have shortcomings. Limitations of the microstrip-CPW frequency divider, as disclosed in U.S. Pat. No. 4,152,680, include: restricted bandwidth due to the use of a balun transformer based on the properties of quarterwave transmission lines; losses due to input and output mismatches; and out-of-band unbalance caused by inherent assymmetry of the balum transformer, leading to excessive harmonic generation and poor isolation between the input and output frequencies. The rectangular-waveguide frequency divider, as disclosed in U.S. Pat. No. 4,228,411, offers improved isolation properties because of its perfectly symmetrical structure but has the following limitations: relatively large size and weight of the necessary waveguide sections; difficult and expensive to manufacture and assemble because of the very precise dimensional requirements; hard to tune and adjust for proper performance, particularly because of the inaccessibility of the interior of the waveguides.

It is a prime objective of the present invention to provide an improved frequency divider which eliminates the problems associated with the prior art. This is achieved by means of a frequency divider structure which not only is symmetrical over an unlimited bandwidth, thereby securing improved harmonic suppression and isolation of the input output frequencies, but also can be constructed using a thin dielectric substrate provided with metal coatings on its surfaces; such an embodiment provides small size, light weight and ease of tuning and adjustment. Accordingly, one aspect of this invention is to provide a braodband microstrip/slotline microwave frequency divider comprising:

(a) a dielectric substrate, bearing upon its first surface a microstrip line open-circuited at one end and upon its second surface a ground plane in which is formed a slotline short-circuited at one end;

(b) a region of said substrate wherein said microstrip line and said slotline overlap each other by a certain length; thereby defining an overlap region.

(c) an even number of matched microwave varactor diodes, each of said diodes having a first terminal and second terminal, said diodes being symmetrically and operatively disposed in said substrate in such a way that the first terminal of each of said diodes is connected to said microstrip line and the second terminal of each of said diodes is connected to said ground plane near an edge of said slotline, the combination of the nonlinear reactances of said varactor diodes and said overlap region forming a parametric subharmonic resonator wherein the nonlinear charge-voltage characteristic of the varactor diodes mediates the transfer of energy from an input signal at frequency 2f entering via said microstrip line to an output signal at frequency f exiting via said slotline.

BRIEF DESCRIPTION OF THE DRAWINGS

Particular embodiments of the present invention will be hereinafter described with reference to the accompanying drawings, wherein.

DETAILED DESCRIPTION OF THE INVENTION WITH REFERENCE TO THE DRAWINGS

Figure 1:
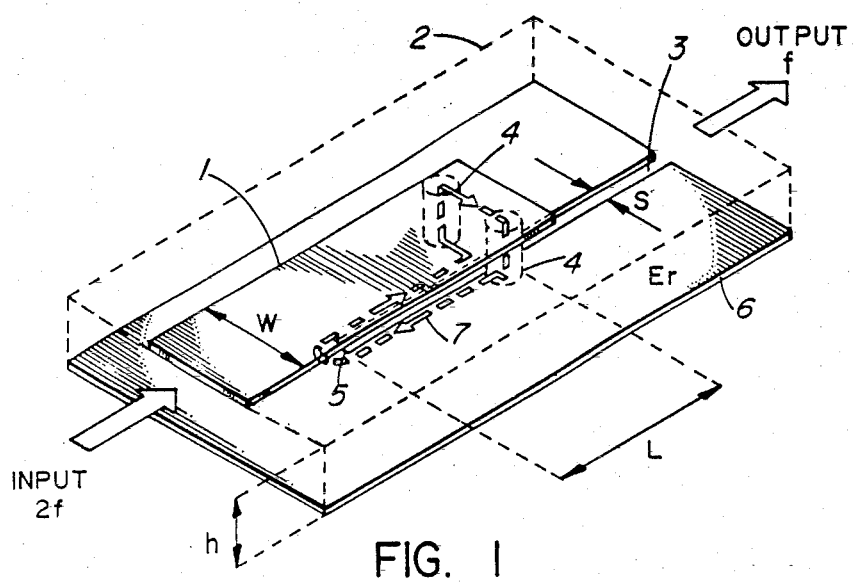
FIG. 1 shows a current path around the resonant loop of the basic frequency divider structure according to this invention in which two varactors are used.

Referring to FIG. 1 there is shown a basic frequency divider structure according to the present invention wherein a microstrip line 1 is positioned on a first side of a dielectric substrate 2 in such a way that it overlaps a slotline 3 on a second side of the said substrate by a length L. At or near the end of microstrip line 1 are at least two varactor diodes 4, symmetrically placed on the two sides of microstrip line 1 and located in holes formed in the dielectric substrate 2. The slotline 3 is so positioned in the ground plane 6 that its centre-line is directly beneath the centre-line of microstrip line 1. The slotline 3 extends beyond the end of microstrip line 1 and is short-circuited at one point 5 underneath microstrip line 1. The terminals of the varactor diodes 4 are electrically connected between the ground plane 6 near the two edges of the slotline 3 and the microstrip line 4. The nonlinear capacitive reactances of the varactor diodes 4, together with the overlapping microstrip/slotline section of length L, form a parametric subharmonic resonator. An input signal at frequency 2f enters the basic frequency divider structure via microstrip line 1 and exits at a frequency f via the slotline 3.

The dashed line 7 in FIG. 1 indicates a current path around the resonant loop. This path includes the two edges of the overlapped slotline section of length L and width S, the varactors 4 and a transverse microstrip section of length W between the varactors 4. An input signal at frequency 2f propagates in a quasi-TEM mode along the microstrip line 1 and pumps the varactors 4 in phase, i.e. the varactors are excited in an even mode.

Figure 2:
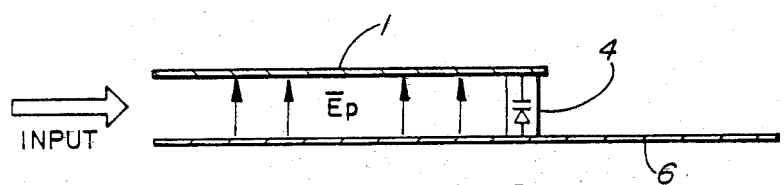
FIG. 2 is an edge view of this basic structure showing a pumping electric field $\overline{E}_p$ in the microstrip, varying at the frequency 2f.
Figure 3:
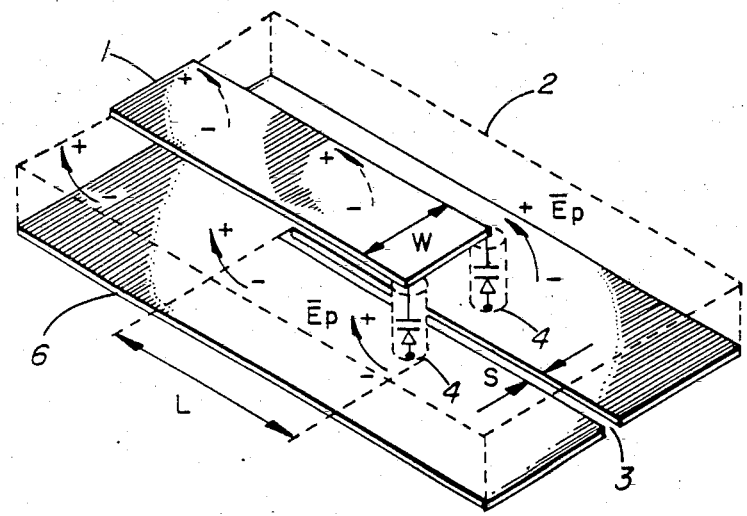
FIG. 3 is an oblique view of this basic structure showing the even mode excitation of the two varactors at frequency 2f.

FIG. 2 is a side view of the basic frequency divider structure showing the microstrip line 1, a varactor 4 and the ground plane 6, and indicating the direction of the pumping electric field $\overline{E}_p$ at the frequency 2f. FIG. 3 is an oblique view of the basic frequency divider structure, showing the input microstrip line 1, varactors 4, ground plane 6 and the output slotline 3; this figure shows how the varactors 4 are pumped by equal electric fields $\overline{E}_p$ at the input frequency 2f.

Figure 4:
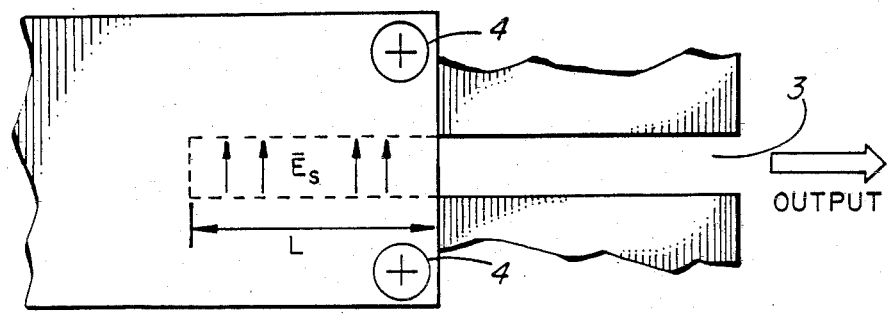
FIG. 4 is a plan view of the slotline side of this basic structure showing a transverse electric field $\overline{E}_s$ in the slotline, varying predominantly at the subharmonic frequency f.

The dimensions L and W of the resonant loop, together with the effective pumped capacitances of the varactors 4, are chosen so that the loop resonant frequency is near f, i.e., near half the input frequency. The resonant frequency is also affected by the width S of the slotline 3 and permittivity $\epsilon_r$ of the dielectric substrate 2. Due to the capacitive loading of the varactors 4, the length L is normally less than a quarter-wavelength at resonance. Because of the nonlinear capacitance-voltage relationship of the varactors 4, there exists a mechanism for transferring energy from the input frequency 2f to the ½subharmonic f. At this frequency f, loop oscillations occur such that the varactor currents (and consequently voltages) are 180° out of phase; i.e., the ½subharmonic is generated in an odd mode. The currents flowing along the edges of the slotline resonator give rise to an electric field $\overline{E}_s$ directed transversely across the slot as shown in FIG. 4. The sinusoidal variation of $E_s$ with time and with distance along the slot 3 gives rise to propogation of energy at the frequency f towards the output.

If the structure is bilaterally symmetrical, and if the varactors 4 have identical dimensions and electrical properties, then at the input frequency 2f, there will be no component of electric field, and hence no potential difference, across the slotline 3. Therefore the slotline 3 will not propagate the input frequency 2f. Consequently there will be no direct coupling between the electric field $\overline{E}_p$ (varying at 2f) in the microstrip, FIG. 2, and the electric field $\overline{E}_s$ (varying at f) in the slotline, FIG. 4. this means that there is isolation between the output and input frequencies.

Figure 5:
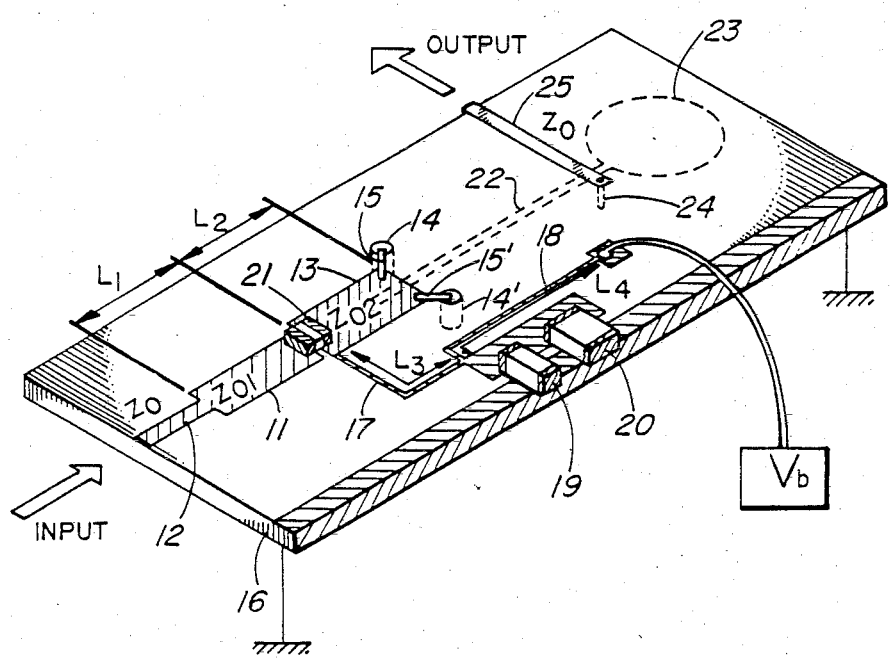
FIG. 5 depicts a practical first embodiment of the frequency divider structure incorporating an input-impedance matching transformer, a dc biasing circuit and an output slotline-to-microstrip transition.

Referring now to FIG. 5, there is shown a first practical embodiment of a balanced frequency divider in which input matching is achieved through the use of a microstrip line 11 of length $L_1$, and characteristic impedance $Z_{01}$ which acts as an impedance transformer between the input line 12 of impedance $Z_0$ (typically 50 ohms) and a third line 13 of length $L_2$ and low impedance $Z_{02}$. The upper electrodes of the matched pair of varactors 14 and 14' are attached to line 13 by means of small electrically-conductive tabs 15 and 15'. The lower electrodes (not shown) are connected to the ground-plane 16. Either varactor orientation can be used, provided both varactors point in the same direction. The varactors can be biased to a dc voltage $V_b$ via a choke circuit consisting of high impedance lines 17 and 18 of lengths $L_3$ and $L_4$, together with chip capacitor 19 and chip resistor 20 to ground. The lengths $L_3$ and $L_4$ are approximately a quarter-wavelength long at the frequency 2f. Another chip capacitor 21 isolates $V_b$ from the input circuit. This type of choke circuit is suitable for frequencies up to about 2 GHz.

A classical slotline-to-microstrip transition of the type first described by de Ronde in "A New Class of Microstrip Directional Couplers", IEEE - GMTT International Microwave Symposium Digest May 1970, pp. 184–189 and subsequently described by Schiek and Kohler in "An Improved Microstrip-to-Microslot Transition", IEEE Transactions on Microwave Theory and Techniques, April 1976, pp. 231–233, is used to achieve a microstrip output line. The output slotline 22 is provided with an open circuit 23. An output microstrip line 25 crosses over the slotline very close to the open circuit 23. The output microstrip is shorted to ground near the slotline via a conducting post 24. The varactor diodes can be of the type GC-51312-85 manufactured by Frequency Sources Inc., GHZ Division, Chelmsford, Mass.; the dielectric substrate can be RT/duroid type 6010 manufactured by Rogers Corporation, Microwave Materials Division, Chandler, Ariz.

Figure 6:
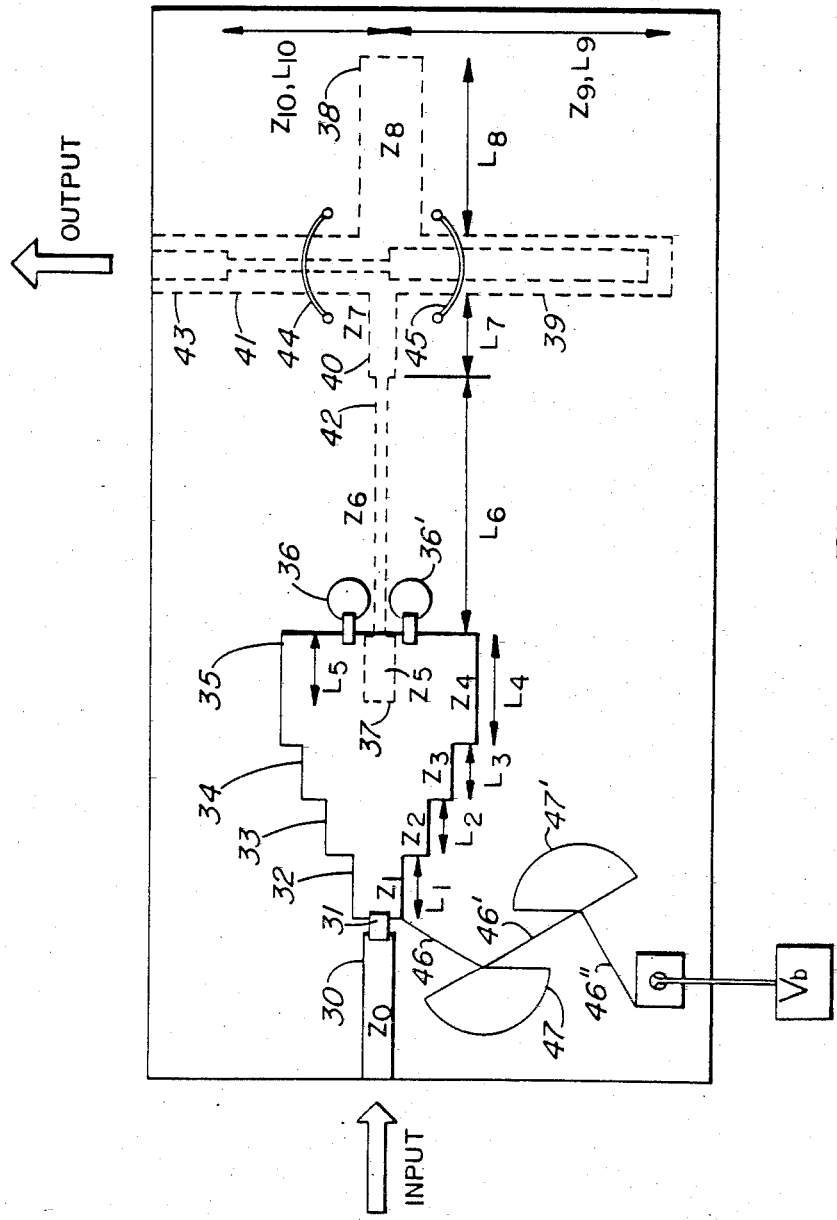
FIG. 6 illustrates a practical second embodiment of the frequency divider structure incorporating a multiple-step input-impedance matching transformer, a dc biasing circuit and an improved slotline-to-microstrip transition which also acts as an output impedance-matching transformer.

FIG. 6 depicts a modified practical frequency divider embodiment according to this invention in which an enhanced output match and a superior transition from slotline to coplanar waveguide can be obtained simultaneously by using a planar fourth-order balun structure. This balun is an improvement of the coplanar-waveguide-to-slotline transition proposed by Houdart in "Various Excitation of Coplanar Waveguide", 1979 IEEE International Microwave Symposium, Digest p. 116-118, and is a planar embodiment of the coaxial fourth-order balun described by Marchand in "Transmission Line Cnoversion Transformers", Electronics, Vol. 17, December 1944, pp. 142-145. FIG. 6 also incorporates a multi-step microstrip transformer for improved wideband input matching and a dc choke circuit more suitable for use at microwave frequencies in excess of about 2 GHz. In FIG. 6 an input microstrip line 30 is connected via a dc-blocking chip capacitor 31 to a multi-section impedance-matching transformer consisting of four contiguous microstrip sections 32, 33, 34 and 35. These sections have lengths $L_1$, $L_2$, $L_3$ $L_4$. As is well known in the art, such a transformer can provide a wideband impedance match between a (50 ohm) input line 30 and a frequency-dependent impedance such as the input impedance of the two pumped varactors 36 and 36' in parallel. Beneath the said microstrip transformer is a short-circuited slotline section 37 of length $L_5$, which, together with the nonlinear capacitive reactances of varactors 36 and 36', forms a parametric subharmonic resonator as previously described herein with reference to FIG. 1. A dc bias voltage $V_b$ may be appropriately applied to the varactors by means of the choke circuit consisting of a plurality of high impedance quarter-wave microstrip lines such as 46, 46' and 46" together with low impedance quarter-wave open-circuited radial microstrip stubs such as 47 and 47', in a manner well known in the art. The generated subharmonic output signal is extracted from the said resonator by means of slot line 42 of length $L_6$ and impedance $Z_6$. The remainder of the output part of the embodiment consists of the planar fourth-order balun formed on the ground-plane side of the substrate. A basic second-order balun of the Marchand type, as known in the art, has an equivalent circuit composed of a parallel short-circuited stub and series open-circuited stub. These elements correspond in FIG. 6 to the shorted slotline 38, of length $L_8$ and impedance $Z_8$, and to the open-circuited coplanar-waveguide (CPW) section 39 of length $L_9$ and impedance $Z_9$. A third-order balun results if an additional line, such as the slotline section 40 of length $L_7$ and impedance $Z_7$, is introduced. The balun becomes fourth-order when a further section, such as the CPW section 41 of length $L_{10}$, is added. As known in the prior art of CPW lines, conductors 44 and 45 advantageously connect adjacent ground-plane regions to ensure equality of potentials. The desired output at frequency f is applied to the external load via the unbalanced coplanar line 43, which may typically have arbitrary length and an impedance of 50 ohms. The advantages of the fourth-order planar balun over other balun transformers known in the prior art are (1) that the four degrees of freedom make it possible to provide a good output match over a wide bandwidth, and (2) that it can be constructed by a simple etching technique.

The wideband frequency-division property of the frequency divider disclosed in the present invention is useful when a broad microwave bandwidth must be compressed down to a narrower band for signal processing purposes. This type of application is significant in the area of electronic countermeasures.

The high frequencies at which microwave power can now be generated and amplified make necessary the provision of means for referencing those frequencies to stable low-frequency oscillators, such as crystal-controlled oscillators. This problem can be solved by using a sequence of N frequency halvers in the feedback path of a phase-locked loop (PLL) so that the frequency of a microwave voltage-controlled oscillator (VCO) can be directly controlled by a crystal oscillator at a frequency $2^N$ time lower. This approach is preferable to the conventional method whereby a low-frequency PLL is followed by frequency multiplication, since the multiplication process will always degrade the spectral purity of the output signal.

Another area in which frequency halvers can be exploited is in the direct demodulation of phase-shifted keyed (PSK) signals under suppressed carrier conditions. In the case of a bi-phase signal, the carrier can be recovered by first multiplying the signal by 2 to remove the phase-coding and then using a PLL as a narrowband filter to remove the switching transients. A frequency halver can then be used to recover the carrier frequency. By applying the carrier and the original signal to a phase comparator, demodulation is accomplished. Extensions of this scheme to 4-phase and higher-order PSK signals are possible.

The embodiments of the invention in which an exclusive property for privilege is claimed are defined as follows:

1. A broadband microstrip/slotline microwave frequency divider comprising:
   (a) a dielectric substrate, bearing upon its first surface a microstrip line open-circulated at one end and upon its second surface a ground plane in which is formed a slotline short-circuited at one end;
   (b) a region of said substrate wherein said microstrip line and said slotline overlap each other thereby defining an overlap region;
   (c) an even number of matched microwave varactor diodes, each of said diodes having a first terminal and a second terminal, said diodes being symmetrically and operatively disposed in such a way that the first terminal of each of said diodes is connected to said microstrip line and the second terminal of each of said diodes is connected to said ground plane near an edge of said slotline, the combination of the nonlinear reactances of said varactor diodes and said overlap region forming a parametric subharmonic resonator wherein the nonlinear charge-voltage characteristics of the varactor diodes mediates the transfer of energy from an input signal at frequency 2 entering via said microstrip line to an output signal at frequency f exiting via said slotline.

2. A microstrip/slotline frequency divider as defined in claim 1, wherein the centre-line of said slotline is positioned directly beneath the centre-line of said microstrip line, one end of said microstrip line extending beyond the short-circuited end of said slotline and one end of said slotline extending beyond the open-circuited end of said microstrip line.

3. A microstrip/slotline frequency divider as defined in claim 2, wherein the microstrip line is extended to provide means for conveying an input signal at frequency 2f to said subharmonic resonator.

4. A microstrip/slotline frequency divider as defined in claim 3, wherein the microstrip line is provided with at least one additional microstrip section having a distinct length and characteristic impedance so as to enhance matching of the source at frequency 2f to said subharmonic resonator.

5. A microstrip/slotline frequency divider as defined in claim 2, wherein the slotline is extended to provide means for conveying the balanced output signal from said subharmonic resonator to a balanced load.

6. A microstrip/slotline frequency divider as defined in claim 5, wherein slotline-to-microstrip transition means is provided to transform the balanced output signal appearing on said slotline to an unbalanced output signal for transmission to an unbalanced load connected to the microstrip of said transition means.

7. A microstrip/slotline frequency divider as defined in claim 5, wherein slotline-to-coplanar-waveguide transition means is provided to transform said balanced output signal appearing on said slotline to an unbalanced output signal for transmission to an unbalanced load connected to the coplanar waveguide of said transition means.

8. A microstrip/slotline frequency divider as defined in claim 6 wherein said transition means is provided with additional slotline sections to provide enhanced impedance matching between said balanced subharmonic resonator and said unbalanced load.

9. A microstrip/slotline frequency divider as defined in claim 6 wherein said transition means is provided with additional microstrip sections to provide enhanced impedance matching between said balanced subharmonic resonator and said unbalanced load.

10. A microstrip/slotline frequency divider as defined in claim 6 wherein said transition means is provided with additional slotline and microstrip sections to provide enhanced impedance matching between said balanced subharmonic resonator and said unbalanced load.

11. A microstrip/slotline frequency divider as defined in claim 7, wherein said transmission means is provided with additional slotline sections, to provide enhanced impedance matching between said balanced subharmonic resonator and said unbalanced load.

12. A microstrip/slotline frequency divider as defined in claim 7, wherein said transmission means is provided with additional coplanar sections, to provide enhanced impedance matching between said balanced subharmonic resonator and said unbalanced load.

13. A microstrip/slotline frequency divider as defined in claim 7, wherein said transmission means is provided with additional slotline and coplanar sections, to provide enhanced impedance matching between said balanced subharmonic resonator and said unbalanced load.

14. A microstrip/slotline frequency divider as defined in claim 7 wherein the varactor diodes are biased via a choke circuit means.

* * * * *